United States Patent
Hakuma et al.

(10) Patent No.: US 8,691,619 B2
(45) Date of Patent: Apr. 8, 2014

(54) LAMINATED STRUCTURE FOR CIS BASED SOLAR CELL, AND INTEGRATED STRUCTURE AND MANUFACTURING METHOD FOR CIS BASED THIN-FILM SOLAR CELL

(75) Inventors: Hideki Hakuma, Tokyo (JP); Katsuya Tabuchi, Tokyo (JP); Yosuke Fujiwara, Tokyo (JP); Katsumi Kushiya, Tokyo (JP)

(73) Assignee: Showa Shell Sekiyu, K.K., Tokyo (JP)

( * ) Notice: Subject to any disclaimer, the term of this patent is extended or adjusted under 35 U.S.C. 154(b) by 33 days.

(21) Appl. No.: 12/743,686

(22) PCT Filed: Nov. 25, 2008

(86) PCT No.: PCT/JP2008/071318
§ 371 (c)(1),
(2), (4) Date: May 19, 2010

(87) PCT Pub. No.: WO2009/069582
PCT Pub. Date: Jun. 4, 2009

(65) Prior Publication Data
US 2010/0267190 A1 Oct. 21, 2010

(30) Foreign Application Priority Data
Nov. 30, 2007 (JP) .................... 2007-311540

(51) Int. Cl.
*H01L 31/18* (2006.01)
(52) U.S. Cl.
USPC 438/95; 136/265; 257/E31.007; 257/E31.027; 438/102
(58) Field of Classification Search
USPC ............ 438/95, 94, 102; 257/E31.007, 257/E31.027; 136/265
See application file for complete search history.

(56) References Cited

U.S. PATENT DOCUMENTS

| | | | |
|---|---|---|---|
| 4,611,091 A | 9/1986 | Choudary et al. | |
| 4,638,111 A | 1/1987 | Gay | |
| 5,891,264 A * | 4/1999 | Shinohara et al. | 136/261 |

(Continued)

FOREIGN PATENT DOCUMENTS

| | | |
|---|---|---|
| CN | 1820358 A | 8/2006 |
| DE | 3688987 T2 | 4/1994 |

(Continued)

OTHER PUBLICATIONS

International Search Report for PCT Patent App. No. PCT/JP2008/071318 (Mar. 10, 2009).

*Primary Examiner* — John C Ingham
(74) *Attorney, Agent, or Firm* — Cermak Nakajima LLP; Tomoko Nakajima

(57) ABSTRACT

This invention aims to provide a laminated structure and an integrated structure of a high production efficiency for a CIS based thin-film solar cell, which can produce a high-resistance buffer layer of the CIS based thin-film solar cell efficiently on a series of production lines and which needs no treatment of wastes or the like, and a manufacturing method for the structures. The CIS based thin-film solar cell includes a back electrode, a p-type CIS based light absorbing layer, a high-resistance buffer layer and an n-type transparent conductive film laminated in this order. The high-resistance buffer layer and the n-type transparent conductive film are formed of thin films of a zinc oxide group. The buffer layer contacts the p-type CIS based light absorbing layer directly, and has a resistivity of $500\Omega\cdot cm$ or higher.

4 Claims, 10 Drawing Sheets

(56) References Cited

U.S. PATENT DOCUMENTS

| | | | |
|---|---|---|---|
| 5,981,868 A * | 11/1999 | Kushiya et al. | 136/262 |
| 8,093,096 B2 * | 1/2012 | Kushiya | 438/94 |
| 2006/0180200 A1 * | 8/2006 | Platzer Bjorkman et al. | 136/265 |
| 2007/0116986 A1 | 5/2007 | Garg et al. | |
| 2007/0172591 A1 * | 7/2007 | Seo et al. | 427/248.1 |
| 2008/0096376 A1 * | 4/2008 | Li et al. | 438/597 |

FOREIGN PATENT DOCUMENTS

| | | |
|---|---|---|
| EP | 0204567 A2 | 12/1986 |
| EP | 1620888 | 2/2006 |
| EP | 1788119 A1 | 5/2007 |
| EP | 1898469 A1 | 3/2008 |
| JP | 61-279181 A | 12/1986 |
| JP | 62-8578 A | 1/1987 |
| JP | 06-209116 A | 7/1994 |
| JP | 08-330614 A | 12/1996 |
| JP | 3249342 B2 | 11/2001 |
| JP | 2004-047916 A | 2/2004 |
| JP | 2005-228975 A | 8/2005 |
| JP | 2006-525671 A | 11/2006 |
| JP | 2006-332440 A | 12/2006 |
| JP | 2007-138300 A | 6/2007 |
| JP | 2007-201304 A | 8/2007 |
| KR | 20070053617 A | 5/2007 |
| WO | WO2004/100250 A1 | 11/2004 |
| WO | WO2006/126598 A1 | 11/2006 |
| WO | WO 2006126598 A1 * | 11/2006 ............ H01L 31/42 |
| WO | WO2007/086521 A1 | 8/2007 |

* cited by examiner

| |
|---|
| 15 |
| 14 |
| 13 |
| 12 |
| 11 |

(b)

| |
|---|
| 15 |
| 111 |
| 110 |
| 13 |
| 12 |
| 11 |

(a)

(b)

LAMINATED STRUCTURE FOR CIS BASED SOLAR CELL, AND INTEGRATED STRUCTURE AND MANUFACTURING METHOD FOR CIS BASED THIN-FILM SOLAR CELL

This application is a national phase entry under 35 U.S.C. §371 of PCT Patent Application No. PCT/JP2008/071318, filed on Nov. 25, 2008, which claims priority under 35 U.S.C. §119 to Japanese Patent Application No. 2007-311540, filed Nov. 30, 2007, both of which are incorporated by reference.

TECHNICAL FIELD

The present invention relates to a laminated structure of a CIS based thin-film solar cell and a method for manufacturing the CIS based solar cell.

BACKGROUND ART

Currently, the CIS based thin-film solar cell is widely and practically used. When manufacturing the CIS based solar cell, it is assumed that the thin-film solar cell having high conversion efficiency may be obtained by allowing a cadmium sulfide (CdS) layer to grow as a high-resistance buffer layer on a light absorbing layer formed of a $CuInSe_2$ thin film. Patent Document 1 discloses that, in a chemical bath deposition method for chemically forming a CdS thin film from solution, by immersing the $CuInSe_2$ thin-film light absorbing layer in the solution, high-quality heterojunction with the thin-film light absorbing layer is formed and there is an effect to increase shunt resistance.

Also, Patent Document 2 discloses the manufacturing method capable of obtaining the thin-film solar cell having high conversion efficiency equivalent to that obtained when the CdS layer is used as the buffer layer, by using zinc mixed crystal compound containing oxygen, sulfur and hydroxyl, that is, $Zn(O, S, OH)_x$ chemically grown from the solution on the p-type light absorbing layer as the high-resistance buffer layer.

However, in the conventional invention disclosed in Patent Document 1, although the effort has been made to minimize wastes containing Cd having high toxicity when allowing the cadmium sulfide (CdS) layer to grow as the high-resistance buffer layer, since solid CdS and alkaline wastes are generated in large volume, there has been a problem that a waste treatment cost becomes higher and a manufacturing cost of the CIS solar cell becomes higher.

Also, Patent Document 2 discloses the manufacturing method effective for eliminating the CdS buffer layer, which is considered to be essential in the method for manufacturing the thin-film solar cell having high conversion efficiency. In this case also, mixture of solid ZnO/ZnS and alkaline wastes are generated in large volume, so that there has been a problem that the waste treatment cost makes the manufacturing cost of the solar cell high.

Also, since the chemical bath deposition method is non-equilibrium chemical reaction, there has been a problem that film-formation by stable reaction at a certain point may not be performed.

Also, there has been a problem in production that the more the production scale increases, the larger the waste plant required for detoxifying ammonia used for maintaining alkaline property of the solution.

Also, since in-line manufacturing is not possible in the chemical bath deposition method, there has been a problem that production efficiency deteriorates.

In view of such circumstances, it has been earnestly desired to consistently carry out the film-formation of the back electrode layer to the film-formation of the window layer (transparent conductive film) by a dry process instead of a wet process such as the solution growth method when forming the high-resistance buffer layer.

Particularly, since an enormous cost is required in the treatment of wastes containing Cd having high toxicity, a Cd-free film-forming method has been earnestly desired.

Patent Document 1: U.S. Pat. No. 4,611,091
Patent Document 2: Japanese Patent No. 3249342
Patent Document 3: Japanese Patent Application Laid-Open No. 2006-332440

DISCLOSURE OF THE INVENTION

Problems to be Solved by the Invention

In view of such circumstances, the applicant of the present invention has proposed, in Japanese Patent Application Laid-Open No. 2006-332440 (Patent Document 3), the sequential film-forming method for sequentially depositing the high-resistance buffer layer and the window layer in this order on the light absorbing layer of the solar cell half-finished substrate obtained by forming the metal back electrode layer and the optical absorptive layer in this order on the glass substrate in order to obtain output properties equivalent to those of the film-forming method by the conventional chemical bath deposition by sequentially forming the high-resistance buffer layer and the window layer (transparent conductive film) by an MOCVD method in the CIS based thin-film solar cell; however there has been room for further improvement.

Also, in order to solve such a problem, an atomic layer deposition (ALD) method enabling uniform film thickness control at an atomic layer level to form a film having high film quality and high step coatability is considered.

Although the ALD method effective as an extremely-thin film forming method may obtain relatively high conversion efficiency in a small area, there has been a problem that it is extremely difficult to make the area larger for mass production.

Also, since a film-forming rate is extremely slow in the ALD method, there has been a problem that the productivity deteriorates.

The present invention has been made to solve the above-described problems, and an object thereof is to obtain a CIS based thin-film solar cell having high production efficiency and a method for manufacturing the same capable of efficiently producing the high-resistance buffer layer of the CIS based thin-film solar cell on a series of production lines, which needs no treatment of wastes and the like.

Also, another object of the present invention is to provide a laminated structure capable of reducing power collecting resistance loss of the CIS based solar cell to improve the conversion efficiency.

Means for Solving the Problems

In order to achieve the above-described objects, an aspect of the present invention provides a CIS based thin-film solar cell obtained by laminating a back electrode, a p-type CIS based light absorbing layer, a high-resistance buffer layer and an n-type transparent conductive film in this order, wherein the high-resistance buffer layer and the n-type transparent conductive film are formed of thin films of a zinc oxide group, the high-resistance buffer layer contacts the p-type CIS based light absorbing layer directly, and a resistivity of the high-resistance buffer layer is 500Ω·cm or higher.

Also, another aspect of the present invention provides a CIS based thin-film solar cell obtained by laminating a back electrode layer, a p-type CIS based light absorbing layer, a high-resistance buffer layer and an n-type transparent conductive film in this order, wherein the high-resistance buffer layer and the n-type transparent conductive film are formed of thin films of a zinc oxide group, the high-resistance buffer layer contacts the p-type CIS based light absorbing layer directly, and boron concentration of the high-resistance buffer layer is $1 \times 10^{19}$ atoms/cm$^3$ or lower.

Still another aspect of the present invention provides a CIS based thin-film solar cell obtained by laminating a back electrode layer, a p-type CIS based light absorbing layer, a high-resistance buffer layer and an n-type transparent conductive film in this order, wherein the high-resistance buffer layer and the n-type transparent conductive film are formed of thin films of a zinc oxide group, and the high-resistance buffer layer contacts the p-type CIS based light absorbing layer directly and boron concentration of the high-resistance buffer layer tilts so as to increase from a side of the p-type CIS based light absorbing layer toward a side of the transparent conductive film.

Another aspect of the present invention provides a CIS based thin-film solar cell obtained by laminating a back electrode layer, a p-type CIS based light absorbing layer, a high-resistance buffer layer and an n-type transparent conductive film in this order, wherein the high-resistance buffer layer and the n-type transparent conductive film are formed of thin films of a zinc oxide group, and the high-resistance buffer layer contacts the p-type CIS based light absorbing layer directly and sulfur concentration of the high-resistance buffer layer tilts so as to decrease from a side of the p-type CIS based light absorbing layer toward a side of the transparent conductive film.

Another aspect of the present invention provides a CIS based thin-film solar cell obtained by laminating a back electrode layer, a p-type CIS based light absorbing layer, a high-resistance buffer layer and an n-type transparent conductive film in this order, wherein the high-resistance buffer layer and the n-type transparent conductive film are formed of thin films of a zinc oxide group, and the high-resistance buffer layer contacts the p-type CIS based light absorbing layer directly and aluminum concentration of the high-resistance buffer layer tilts so as to increase from a side of the p-type CIS based light absorbing layer toward a side of the transparent conductive film.

Another aspect of the present invention provides a CIS based thin-film solar cell obtained by laminating a back electrode layer, a p-type CIS based light absorbing layer, a high-resistance buffer layer and an n-type transparent conductive film in this order, wherein the high-resistance buffer layer and the n-type transparent conductive film are formed of thin films of a zinc oxide group, and the high-resistance buffer layer contacts the p-type CIS based light absorbing layer directly and gallium concentration of the high-resistance buffer layer tilts so as to increase from a side of the p-type CIS based light absorbing layer toward a side of the transparent conductive film.

A film thickness of the high-resistance buffer layer may be 20 to 300 nm.

Also, the sulfur concentration of the high-resistance buffer layer in an area contacting the p-type CIS based light absorbing layer may be 0.1 to 10 mol %.

The n-type transparent conductive film may be a boron-containing thin film of a zinc oxide group.

The aluminum concentration of the high-resistance buffer layer may be $1 \times 10^{19}$ atoms/cm$^3$ or lower.

The gallium concentration of the high-resistance buffer layer may be $1 \times 10^{19}$ atoms/cm$^3$ or lower.

The high-resistance buffer layer may be formed by an MOCVD method.

An aspect of the present invention provides an integrated structure of a CIS based thin-film solar cell laminated by the above-described laminated structure, wherein, in a pattern forming portion separating the p-type CIS based light absorbing layer, the back electrode is connected to the n-type transparent conductive film directly.

Another aspect of the present invention provides an integrated structure of a CIS based thin-film solar cell laminated by the above-described laminated structure, wherein in a pattern forming portion separating the p-type CIS based light absorbing layer, the back electrode is connected to the n-type transparent conductive film through the high-resistance buffer layer, and a product of the resistivity and a film thickness of the buffer layer is $1 \times 10^{-3}$ to $1 \times 10^{-1}$ Ω·cm$^2$.

Another aspect of the present invention provides an integrated structure of a CIS based thin-film solar cell laminated by the above-described laminated structure, wherein in a pattern forming portion separating the p-type CIS based light absorbing layer, the back electrode is connected to the n-type transparent conductive film directly, and a layer formed by reaction of the back electrode layer and selenium and/or sulfur may be present between the back electrode and the n-type transparent conductive film or between the back electrode and the high-resistance buffer layer.

Another aspect of the present invention provides an integrated structure of a CIS based thin-film solar cell laminated by the above-described laminated structure, wherein in a pattern forming portion separating the p-type CIS based light absorbing layer, the back electrode is connected to the n-type transparent conductive film through the high-resistance buffer layer, a product of the resistivity and a film thickness of the buffer layer is $1 \times 10^{-3}$ to $1 \times 10^{-1}$ Ω·cm$^2$, and a layer formed by reaction of the back electrode layer and selenium and/or sulfur may be present between the back electrode and the n-type transparent conductive film or between the back electrode and the high-resistance buffer layer.

Another aspect of the present invention provides an integrated structure of a CIS based thin-film solar cell laminated by the above-described laminated structure, wherein in a pattern forming portion separating the p-type CIS based light absorbing layer, the back electrode is connected to the n-type transparent conductive film directly, and boron concentration of the n-type transparent conductive film in an area connected to the back electrode may be $1 \times 10^{20}$ atoms/cm$^3$ or higher.

Another aspect of the present invention provides an integrated structure of a CIS based thin-film solar cell laminated by the above-described laminated structure, wherein in a pattern forming portion separating the p-type CIS based light absorbing layer, the back electrode is connected to the n-type transparent conductive film through the high-resistance buffer layer, a product of the resistivity and a film thickness of the buffer layer is $1 \times 10^{-3}$ to $1 \times 10^{-1}$ Ω·cm$^2$, and boron concentration of the n-type transparent conductive film in an area connected to the back electrode may be $1 \times 10^{20}$ atoms/cm$^3$ or higher.

Another aspect of the present invention provides an integrated structure of a CIS based thin-film solar cell laminated by the above-described laminated structure, wherein in a pattern forming portion separating the p-type CIS based light absorbing layer, the back electrode is connected to the n-type transparent conductive film directly, and aluminum concentration of the n-type transparent conductive film in an area connected to the back electrode may be $1\times10^{20}$ atoms/cm$^3$ or higher.

Another aspect of the present invention provides an integrated structure of a CIS based thin-film solar cell laminated by the above-described laminated structure, wherein in a pattern forming portion separating the p-type CIS based light absorbing layer, the back electrode is connected to the n-type transparent conductive film through the high-resistance buffer layer, a product of the resistivity and a film thickness of the buffer layer is $1\times10^{-3}$ to $1\times10^{-1}\Omega\cdot$cm$^2$, and aluminum concentration of the n-type transparent conductive film in an area connected to the back electrode may be $1\times10^{20}$ atoms/cm$^3$ or higher.

Another aspect of the present invention provides an integrated structure of a CIS based thin-film solar cell laminated by the above-described laminated structure, wherein in a pattern forming portion separating the p-type CIS based light absorbing layer, the back electrode is connected to the n-type transparent conductive film directly, and gallium concentration of the n-type transparent conductive film in an area connected to the back electrode may be $1\times10^{20}$ atoms/cm$^3$ or higher.

Another aspect of the present invention provides an integrated structure of a CIS based thin-film solar cell laminated by the above-described laminated structure, wherein in a pattern forming portion separating the p-type CIS based light absorbing layer, the back electrode is connected to the n-type transparent conductive film through the high-resistance buffer layer, a product of the resistivity and a film thickness of the buffer layer is $1\times10^{-3}$ to $1\times10^{-1}\Omega\cdot$cm$^2$, and gallium concentration of the n-type transparent conductive film in an area connected to the back electrode may be $1\times10^{20}$ atoms/cm$^3$ or higher.

A method for manufacturing a CIS based thin-film solar cell according to an aspect of the present invention includes the steps of: making a back electrode on a substrate; forming a p-type CIS based light absorbing layer on the back electrode; forming a buffer layer formed of a thin film of a zinc oxide group directly on the p-type CIS based light absorbing layer; and forming an n-type transparent conductive film formed of the thin film of a zinc oxide group on the buffer layer, wherein the buffer layer forming step is performed by an MOCVD method, and a substrate temperature of the buffer layer forming step is made higher than the substrate temperature at the time of forming the n-type transparent conductive film.

Also, the substrate temperature at the time of forming the buffer layer may be 190 to 300° C.

Also, the n-type transparent conductive film may be formed by the MOCVD method.

Another method for manufacturing a CIS based thin-film solar cell according to the present invention includes the steps of: making a back electrode on a substrate; forming a p-type CIS based light absorbing layer on the back electrode; forming a buffer layer formed of a thin film of a zinc oxide group directly on the p-type CIS based light absorbing layer; and forming an n-type transparent conductive film formed of the thin film of a zinc oxide group on the buffer layer, wherein the buffer layer forming step and the n-type transparent conductive film forming step are performed by an MOCVD method, and a material molar ratio ([O]/[Zn]) of the buffer layer forming step is made higher than the material molar ratio ([O]/[Zn]) of the n-type transparent conductive film forming step.

The material molar ratio ([O]/[Zn]) of the buffer layer forming step may be 2 or higher.

The buffer layer forming step may be performed by the MOCVD method and a film forming rate of the buffer layer may be 15 nm per minute or higher.

Effect of the Invention

According to the present invention, since entire production lines can be carried out by a dry treatment process, the high-resistance buffer layer can be formed efficiently and stably.

Also, since the high-resistance buffer layer can be formed without using the solution growth method, the waste treatment plant for detoxifying ammonia required at the time of film-formation by the solution growth method as in the conventional case is not required and the production efficiency becomes high, so that the production cost can be reduced.

Also, the process in the larger area is possible and the film-forming rate is dramatically higher as compared to the ALD method, which is another dry manufacturing method, so that the productivity can be improved.

Also, according to the laminated structure of the present invention, the power collecting resistance loss can be reduced.

BRIEF DESCRIPTION OF THE DRAWINGS

FIG. 1(a) is a view illustrating a laminated structure of a CIS based solar cell according to an embodiment of the present invention, and FIG. 1(b) is a view illustrating a laminated structure of a CIS based solar cell according to a conventional embodiment.

Figure 2:
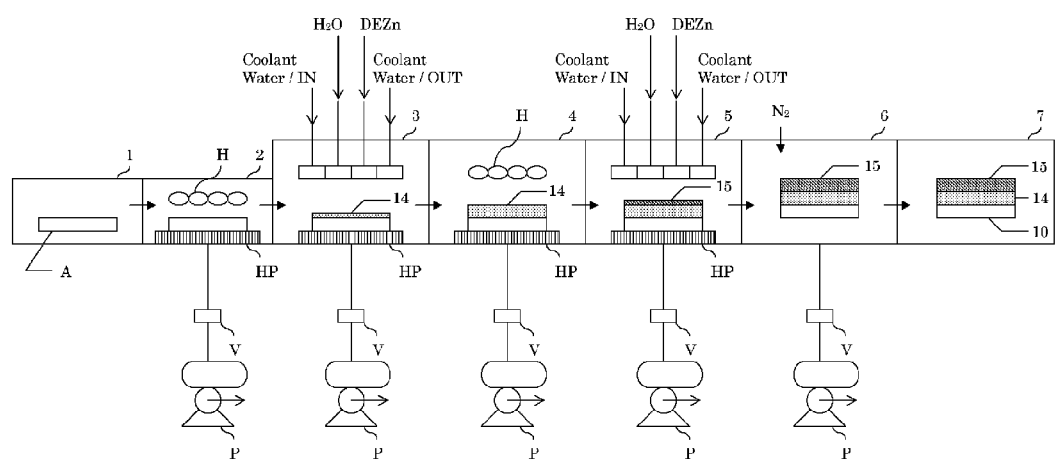
FIG. 2 is a schematic view illustrating a film-forming process of a buffer layer and a window layer.

DESCRIPTION OF LETTERS AND NUMERALS 1 substrate introducing section
2 preliminary heating chamber
3 high-resistance buffer layer forming chamber
4 vacuum drying chamber-cum-preliminary heating chamber
5 window layer forming chamber
6 cooling chamber
7 substrate taking-out section
A solar cell half-finished substrate
H heater
HP hot plate
P vacuum pump with mechanical booster
V valve
11 glass substrate 12 back electrode layer
13 light absorbing layer
14 high-resistance buffer layer
15 window layer
110 CBD buffer layer
111 ZnO buffer layer

BEST MODE FOR CARRYING OUT THE INVENTION

A laminated structure of a CIS based thin-film solar cell according to this embodiment will be described.

Figure 1:
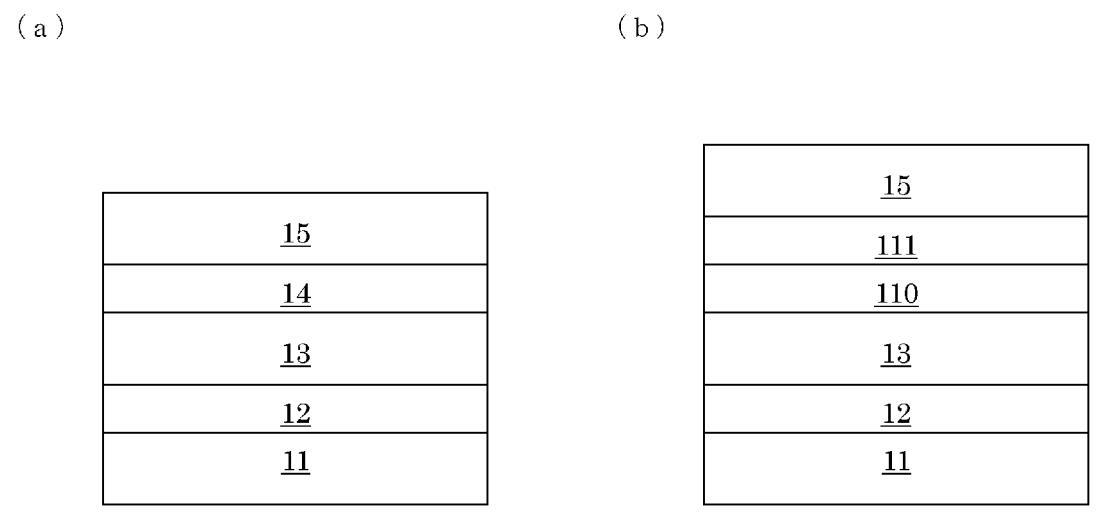

As illustrated in FIG. 1(a), a CIS based thin-film solar cell 1 according to this embodiment forms a p-n heterojunction device having a substrate structure obtained by laminating a glass substrate 11, a metal back electrode layer 12, a p-type CIS based light absorbing layer (hereinafter, simply referred to as an "light absorbing layer") 13, a high-resistance buffer layer 14, an n-type window layer (transparent conductive film (hereinafter, simply referred to as a "window layer")) 15 in this order.

The glass substrate 11 is a substrate on which the above-described layers are laminated, and a glass substrate such as soda-lime glass, a metal substrate such as a stainless plate and a resin substrate such as a polyimide film are used.

The metal back electrode layer 12 is highly corrosion-resistant metal such as Mo or Ti having a high melting point and a thickness of 0.2 to 2 μm and made on the glass substrate 11, and is formed by a DC sputtering method and the like by using the metal as a target.

The light absorbing layer 13 is a thin film having a thickness of 1 to 3 μm with a I-III-VI$_2$ group chalcopyrite structure having p-type conductivity, and a multiple compound semiconductor thin film such as CuInSe$_2$, Cu(InGa)Se$_2$, and Cu(InGa)(SSe)$_2$. In addition to these, examples of the light absorbing layer 13 include a selenide-based CIS based light absorbing layer, a sulfide-based CIS based light absorbing layer and a selenide/sulfide-based CIS based light absorbing layer. The selenide-based CIS based light absorbing layer is made of CuInSe$_2$, Cu(InGa)Se$_2$ or CuGaSe$_2$, the sulfide-based CIS based light absorbing layer is made of CuInS$_2$, Cu(InGa)S$_2$ or CuGaS$_2$ and the selenide/sulfide-based CIS based light absorbing layer is made of CuIn(SSe)$_2$, Cu(InGa)(SSe)$_2$ and CuGa(SSe)$_2$, and as the one having a surface layer, there are CuInSe$_2$ having CuIn(SSe)$_2$ as the surface layer, Cu(InGa)Se$_2$ having CuIn(SSe)$_2$ as the surface layer, Cu(InGa)(SSe)$_2$ having CuIn(SSe)$_2$ as the surface layer, CuGaSe$_2$ having CuIn(SSe)$_2$ as the surface layer, Cu(InGa)Se$_2$ having Cu(InGa)(SSe)$_2$ as the surface layer, CuGaSe$_2$ having Cu(InGa)(SSe)$_2$ as the surface layer, Cu(InGa)Se$_2$ having CuGa(SSe)$_2$ as the surface layer, and CuGaSe$_2$ having CuGa(SSe)$_2$ as the surface layer.

There are two representative methods for manufacturing the light absorbing layer 13, one of which is a selenization/sulfurization method and the other is a multi source coevaporation method.

In the selenization/sulfurization method, the light absorbing layer 13 can be formed by forming a metal precursor film (Cu/In, Cu/Ga, Cu—Ga alloy/In, Cu—Ga—In alloy and the like) having a laminated structure containing Cu, In and Ga or of mixed crystal thereof on the back electrode layer 12 by a sputtering method, a deposition method or the like, and thereafter applying thermal treatment in atmosphere containing selenium and/or sulfur.

Also, in the multi source coevaporation method, the light absorbing layer 13 can be formed by simultaneously depositing materials containing Cu, In, Ga and Se in appropriate combination on the glass substrate 11 on which the back electrode layer 12 heated to approximately 500° C. or higher is formed.

The window layer 15 is a transparent and low resistance thin film of a zinc oxide group having a thickness of 0.05 to 2.5 μm with a wide band gap having n-type conductivity.

In the n-type window layer 15, any one of or combination of elements of III group of a periodic system such as boron (B), aluminum (Al) and gallium (Ga) is used as dopant.

The high-resistance buffer layer 14 is a transparent and highly resistive ($5\times10^2\Omega\cdot cm$ or higher) thin film of a zinc oxide group.

Although the high-resistance buffer layer 14 is basically formed without dopant (there is no dopant as a material), the layer has a structure containing certain doping impurities (boron (B), aluminum (Al) and gallium (Ga)) due to autodoping from a tray and the like for holding the substrate at the time of film formation and thermal diffusion of the dopant from the transparent conductive film formed in a later process.

Concentrations of the impurities are such that boron (B) concentration is $1\times10^{19}$ atoms/cm$^3$ or lower, aluminum (Al) concentration is $1\times10^{19}$ atoms/cm$^3$ and gallium (Ga) concentration is $1\times10^{19}$ atoms/cm$^3$ or lower.

Also, in the high-resistance buffer layer 14, each of the boron concentration, the aluminum concentration and the gallium concentration tilts so as to increase from a side of the light absorbing layer 13 toward a side of the window layer 15. More specifically, the impurities such as boron, aluminum and gallium in the high-resistance buffer layer 14 gradually increase in concentration from a side contacting the light absorbing layer 13 toward a side contacting the window layer 15.

Also, the high-resistance buffer layer 14 may be a mixed crystal layer in which sulfur (S) is mixed. In this case, by setting sulfur concentration of the mixed crystal layer within a range of 0.1 to 10 mol %, a resistivity of the high-resistance buffer layer 14 may be made higher.

Also, in the high-resistance buffer layer 14, the sulfur concentration may tilt so as to decrease from the side of the light absorbing layer 13 toward the side of the window layer 15. More specifically, the sulfur concentration of the high-resistance buffer layer 14 gradually decreases from the side contacting the light absorbing layer 13 toward the side contacting the window layer 15.

Next, a film-forming method of the high-resistance buffer layer 14 of the CIS based thin-film solar cell according to this embodiment will be described.

Herein, in order to form the high-resistance buffer layer of the conventional CIS based thin-film solar cell, as illustrated in FIG. 1(b), a CBD buffer layer 110 formed by a chemical bath deposition method and a ZnO buffer layer 111 formed by an MOCVD method, the sputtering method or the like are formed on a solar cell half-finished substrate obtained by forming the back electrode layer 12 and the light absorbing layer 13 on the glass substrate 11 in this order.

The CBD buffer layer 110 is made of CdS, ZnS, Zn(O, S, OH)x and the like, and a film thickness thereof is approximately 50 nm or less. The conventional ZnO buffer layer 111 is also formed without dopant.

In the present invention, as illustrated in FIG. 1(a), inhibition of leak current in a p-n junction area is realized by making the resistivity of the high-resistance buffer layer 14 high as in the conventional structure.

In the present invention, by adjusting a substrate temperature when forming the high-resistance buffer layer 14, a material molar ratio ([O]/[Zn]), the doping impurities (B, Al, Ga)

concentration and the sulfur concentration, the resistivity of the high-resistance buffer layer 14 is made high.

Also, by forming the high-resistance buffer layer 14 by the MOCVD method, p-n junction can be formed without physical damage as in the sputtering method.

The manufacturing method according to this embodiment will be described in detail.

As illustrated in FIG. 2, the high-resistance buffer layer 14 is formed in an MOCVD film-forming device in which a plurality of preliminary heating processes and film-forming processes are connected in line.

Herein, FIG. 2 illustrates a device for sequentially forming the high-resistance buffer layer 14 and the window layer 15 by the MOCVD method on a solar cell half-finished substrate A obtained by forming the metal back electrode layer 12 and the light absorbing layer 13 on the glass substrate 11 in this order. The device includes a substrate introducing section 1 for introducing the solar cell half-finished substrate A, a preliminary heating chamber 2 for preliminarily heating the solar cell half-finished substrate A, a high-resistance buffer layer forming chamber 3 for forming the high-resistance buffer layer 14 on the preliminarily heated solar cell half-finished substrate A, a vacuum drying chamber-cum-preliminary heating chamber 4 for drying and preliminarily heating the solar cell half-finished substrate A on which the high-resistance buffer layer is formed, a window layer forming chamber 5 for forming the window layer 15 on the dried and preliminarily heated solar cell half-finished substrate A, a cooling chamber 6 for cooling the solar cell half-finished substrate A on which the high-resistance buffer layer 14 and the window layer 15 are formed, and a substrate taking-out section 7 for taking out the solar cell half-finished substrate A on which the high-resistance buffer layer 14 and the window layer 15 are formed.

A detailed process in the device is such that the solar cell half-finished substrate A obtained by forming the metal back electrode layer 12 and the light absorbing layer 13 on the glass substrate 11 in this order is first introduced from the substrate introducing section 1 into the device.

Next, the solar cell half-finished substrate A is conveyed to the preliminary heating chamber 2 and is preliminarily heated by a heater H to a certain temperature in a state of being mounted on a hot plate HP.

Next, the solar cell half-finished substrate A is conveyed to the high-resistance buffer layer forming chamber 3 and the high-resistance buffer layer 14 is formed by the MOCVD method.

Next, the solar cell half-finished substrate A is conveyed to the vacuum drying chamber-cum-preliminary heating chamber 4 and vacuum drying and preliminary heating are performed.

Next, the solar cell half-finished substrate A is conveyed to the window layer forming chamber 5 and the window layer 15 is formed to have a predetermined film thickness by the MOCVD method.

Next, the solar cell half-finished substrate A is conveyed to the cooling chamber 6 to be cooled and thereafter taken out of the substrate taking-out section 7. In this manner, the CIS based thin-film solar cell obtained by forming the metal back electrode layer 12, the light absorbing layer 13, the high-resistance buffer layer 14 and the window layer 15 on the glass substrate 11 in this order is made.

In the film-forming process, when forming the high-resistance buffer layer 14, in the preliminary heating chamber 2 before the high-resistance buffer layer forming chamber 3, a valve V is first opened to make a vacuum state by a vacuum pump with mechanical booster P to heat to a predetermined temperature range. Then, as soon as the temperature reaches the predetermined temperature, the solar cell half-finished substrate A is conveyed to the high-resistance buffer layer forming chamber 3 of which temperature is kept within the predetermined temperature range, and the high-resistance buffer layer is formed of an organic metal compound of zinc (Zn) and pure water ($H_2O$) as film-forming materials.

Herein, the organic metal compound of zinc (Zn) is dimethyl zinc or diethyl zinc and is desirably diethyl zinc (DEZn), and this compound is charged in a bubbler and bubbling is performed using inert gas such as helium and argon as carrier gas, and the compound is entrained by the carrier gas to be supplied to the high-resistance buffer layer forming chamber 3.

Also, when forming the window layer 15, in the vacuum drying chamber-cum-preliminary heating chamber 4 before the window layer forming chamber 5, the valve V is first opened to make the vacuum state by the vacuum pump with mechanical booster P to heat to the predetermined temperature range. Then, as soon as the temperature reaches the predetermined temperature, the solar cell half-finished substrate A is conveyed to the window layer forming chamber 5 of which temperature is kept within the predetermined temperature range, and the window layer 15 is formed in the window layer forming chamber 5 by using diethyl zinc (DEZn) and pure water ($H_2O$) as the film-forming materials, supplying diborane gas diluted with the inert gas into a material tube and doping boron from diborane.

Meanwhile, the above-described in-line film-forming process relates to the technique disclosed in Japanese Patent Application Laid-Open No. 2006-332440 (filed on Dec. 7, 2006) by the same applicant as that of the present application, and the contents disclosed in Japanese Patent Application Laid-Open No. 2006-332440 (filed on Dec. 7, 2006) are incorporated herein by reference.

Also, although FIG. 2 illustrates that the high-resistance buffer layer 14 and the window layer 15 are formed by the in-line process, the present invention is not limited to this, and it is also possible that the high-resistance buffer layer 14 is formed and is opened to the atmosphere, after which the window layer 15 is formed.

Figure 3:
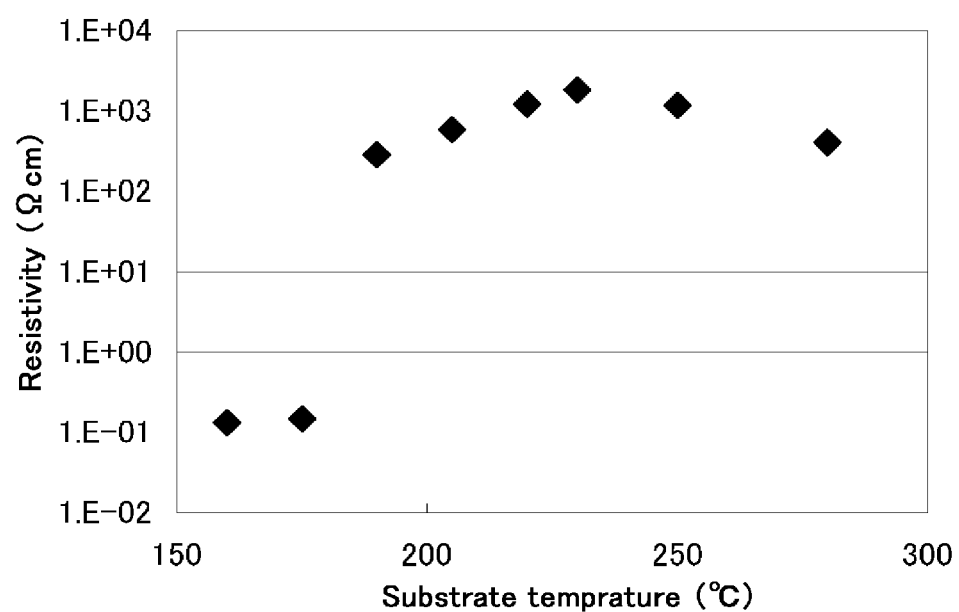
FIG. 3 is a graph illustrating relationship between a substrate temperature and a resistivity.

FIG. 3 illustrates relationship between the substrate temperature and the resistivity when forming the high-resistance buffer layer 14.

As illustrated in FIG. 3, when forming the high-resistance buffer layer 14 by the MOCVD method, the resistivity of the high-resistance buffer layer 14 can be made $5 \times 10^2 \Omega \cdot cm$ or higher by heating the substrate to 190° C. or higher.

Also, relationship between the material molar ratio ([O]/[Zn]) and the resistivity and relationship between the material molar ratio ([O]/[Zn]) and a film-forming rate at that time are illustrated in FIG. 4(a) and FIG. 4(b), respectively.

Figure 4:
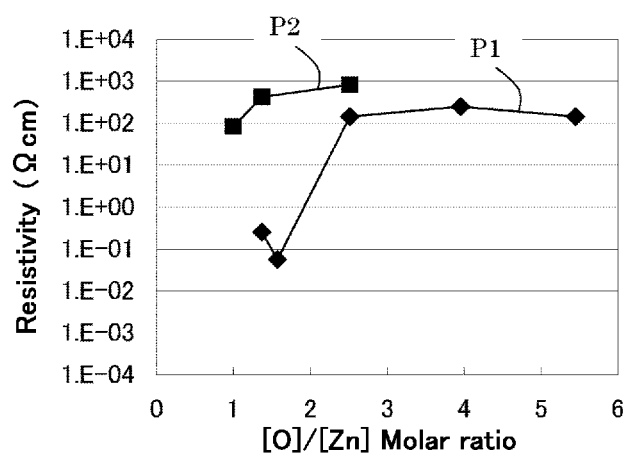
FIG. 4(a) is a graph illustrating relationship between a material molar ratio ([O]/[Zn]) and the resistivity.
FIG. 4(b) is a graph illustrating relationship between the material molar ratio ([O]/[Zn]) and a film-forming rate.
Figure 4:
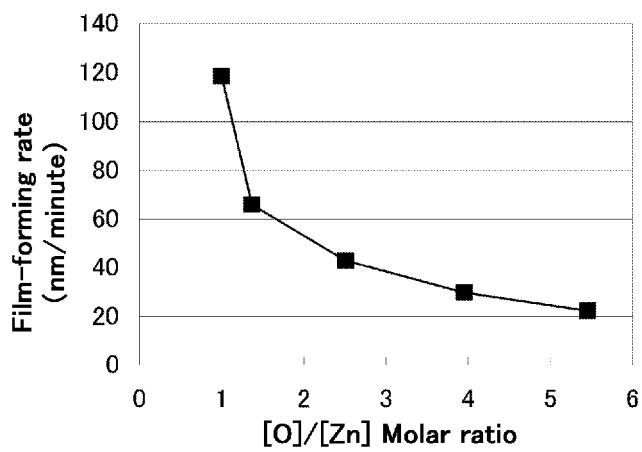

A graph illustrated in FIG. 4 represents change in the resistivity of the high-resistance buffer layer 14 and the film-forming rate when changing the [O]/[Zn] molar ratio by changing diethyl zinc (DEZn) while making a gas flow rate of $H_2O$ constant.

In a graph P1 in FIG. 4(a), the substrate temperature is 175° C. and in a graph P2, the substrate temperature is 205° C. Based on the graphs, the resistivity of $5 \times 10^2 \Omega \cdot cm$ or higher of the high-resistance buffer layer 14 can be achieved by setting the material molar ratio ([O]/[Zn]) to 2 or higher with a substrate achieving temperature of 205° C. or higher.

Also, preferably, the resistivity of $1 \times 10^3 \Omega \cdot cm$ or higher of the high-resistance buffer layer 14 can be achieved by setting the material molar ratio ([O]/[Zn]) to 2.5 or higher with the substrate temperature of 200 to 250° C.

Also, as illustrated in FIG. 4(b), since the film-forming rate of 15 nm per minute is secured in a wide range of material molar ratio ([O]/[Zn]), film-forming time required to form a preferable film thickness of 50 to 300 nm to be described later is less than 20 minutes, so that productivity is higher than those of the chemical bath deposition method and the ALD method. Further preferably, the film-forming time can be made less than 10 minutes by setting the film-forming rate to 30 nm per minute or higher.

Figure 5:
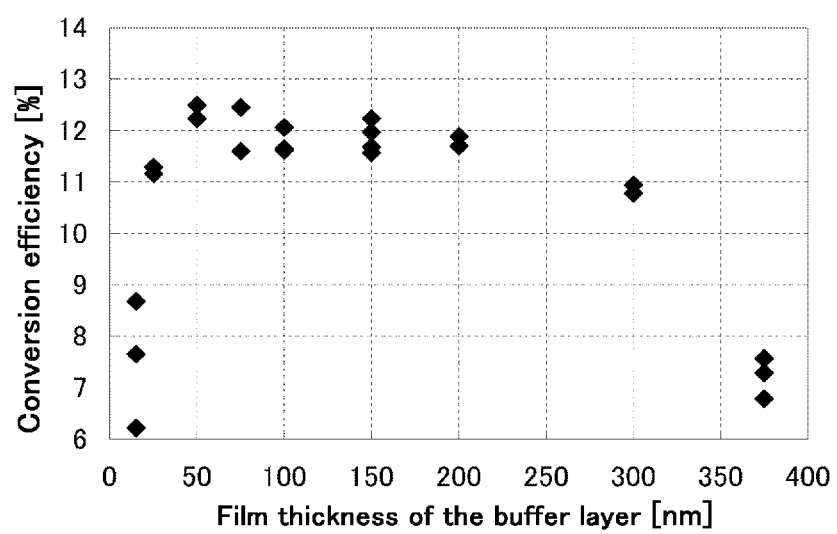
FIG. 5 is a graph illustrating relationship between a film thickness of the buffer layer and conversion efficiency.

FIG. 5 illustrates relationship between the film thickness of the high-resistance buffer layer 14 and conversion efficiency. As illustrated in FIG. 5, the conversion efficiency of 11% or higher can be achieved with the film thickness of 20 to 300 nm of the high-resistance buffer layer 14. Further preferably, the conversion efficiency of 11.5% or higher can be achieved with the film thickness of 50 to 200 nm.

After the high-resistance buffer layer 14 is formed, the window layer 15 is formed by the MOCVD method or the sputtering method.

In the film-forming process of the window layer 15, any one of or combination of the elements of the III-group of the periodic system such as boron (B), aluminum (Al), indium (In) and gallium (Ga) is used as the dopant in order to adjust the resistivity.

The dopant used for adjusting the resistivity in the MOCVD method is gas or volatile (or high-vapor pressure) liquid manufactured as a hydrogenated compound or the organic metal compound, and each dopant is diluted with the inert gas such as helium and argon and is mixed with the carrier gas to entrain a manufacturing material to be supplied to the film-forming process of the window layer (in the MOCVD film-forming device).

Also, in the sputtering method, the film-formation is performed by using the target obtained by mixing the dopant of desired concentration in advance. It is also possible to dilute the hydrogenated compound or the organic metal compound with the inert gas such as helium and argon and mix the same with the carrier gas, which entrains the manufacturing material, to supply the mixture as in the case of the MOCVD method.

As for the window layer 15 formed by the MOCVD method, in the preliminary heating process before the window layer forming process, the substrate is heated to a temperature range of 140 to 250° C., desirably 160 to 190° C. under vacuum, and as soon as the substrate reaches the temperature, the substrate is conveyed to the window layer forming process of which temperature is kept in the temperature range of 160 to 190° C. In the window layer forming process, by using diethyl zinc and pure water as the film-forming materials, supplying diborane gas diluted with the inert gas to have the concentration of 1 to 5 Vol % to the material tube and doping boron from diborane, a low resistance ZnO-based transparent conductive film of which sheet resistance is 10Ω/ or lower, transmissivity is 85% or higher, and a film thickness is in the range of 0.5 to 2.5 μm, desirably 1 to 1.5 μm, is formed. The sheet resistance value is a value providing an indication that series resistance does not affect formation of an integrated structure in the substrate, and when separately forming an extraction electrode on the window layer 15, there is no problem with approximately 100Ω/and the film thickness at that time is approximately 0.05 μm.

Herein, when forming the window layer 15, the film-formation is performed at a temperature lower than the substrate achieving temperature at the time of forming the high-resistance buffer layer 14. That is, the substrate temperature when forming the high-resistance buffer layer 14 is set to be higher than the substrate temperature when forming the window layer 15. By thus setting the temperature, concentration of boron to be diffused to the high-resistance buffer layer 14 can be made $1\times10^{19}$ atoms/cm$^3$ or lower, the concentration of aluminum can be made $1\times10^{19}$ atoms/cm$^3$ or lower, and the concentration of gallium can be made $1\times10^{19}$ atoms/cm$^3$ or lower.

Also, when forming the window layer 15, the film-formation is performed with a flow ratio smaller than the material molar ratio ([O]/[Zn]) at the time of forming the high-resistance buffer layer 14. That is, the material molar ratio ([O]/[Zn]) when forming the high-resistance buffer layer 14 is set to be larger than the material molar ratio ([O]/[Zn]) when forming the window layer 15. By setting such a material molar ratio ([O]/[Zn]), the concentration of boron to be diffused to the high-resistance buffer layer 14 can be made $1\times10^{19}$ atoms/cm$^3$ or lower, the concentration of aluminum can be made $1\times10^{19}$ atoms/cm$^3$ or lower, and the concentration of gallium can be made $1\times10^{19}$ atoms/cm$^3$ or lower.

Next, an example of the integrated structure using the film-forming method of the above-described high-resistance buffer layer will be described.

Figure 6:
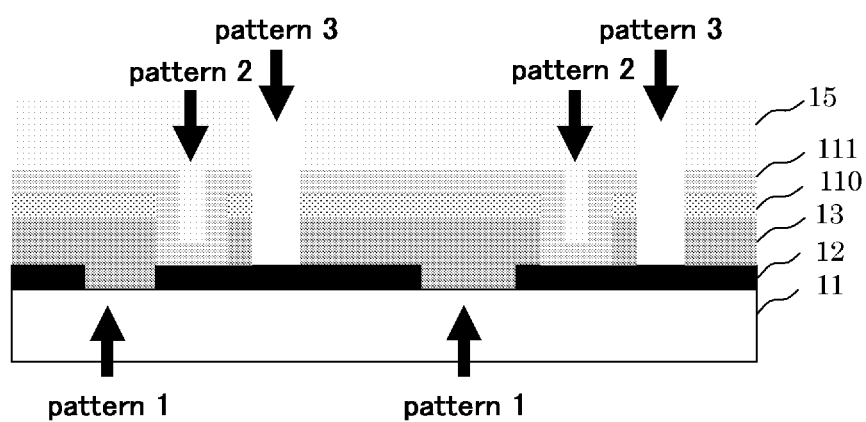
FIG. 6 is a view illustrating the conventional laminated structure.
Figure 7:
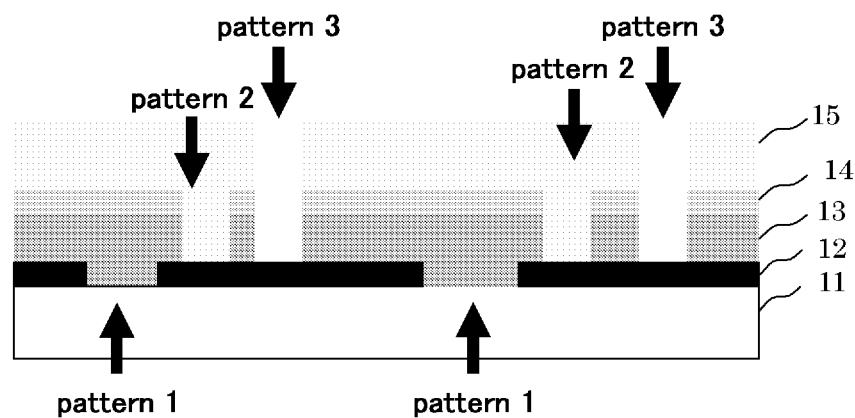
FIG. 7 is a view illustrating an example of the laminated structure according to the present invention.
Figure 8:
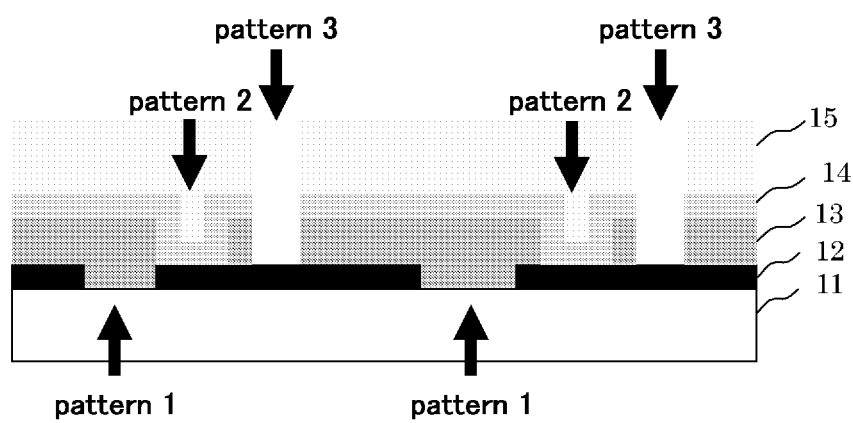
FIG. 8 is a view illustrating an example of the laminated structure according to the present invention.

FIG. 6 illustrates an example of a conventional integrated structure, and FIGS. 7 and 8 illustrate the integrated structure according to the present invention.

In the conventional integrated structure illustrated in FIG. 6, a pattern of the back electrode layer 12 is formed on the substrate 11, and the light absorbing layer 13 and the CBD buffer layer 110 are formed thereon, and at that time, a pattern 2 is formed by a mechanical scribing device or a laser scribing device and the ZnO buffer layer 111 is formed thereon by the MOCVD method.

Since the ZnO buffer layer 111 is formed after forming the pattern 2, the window layer 15 contacts the back electrode layer 12 through the ZnO buffer layer 111 at a portion on which the pattern 2 is formed, so that power collection resistance loss occurs by the highly resistive portion.

In the integrated structure according to the present invention illustrated in FIG. 7, the back electrode layer 12 is first formed on the substrate 11, the back electrode layer 12 is formed into a predetermined electrode pattern (pattern 1) by the laser scribing device, and the light absorbing layer 13 is formed on the back electrode layer 12.

Then, based on a condition of the above-described embodiment, the high-resistance buffer layer 14 is formed on the light absorbing layer 13 by the MOCVD method.

In a state in which the high-resistance buffer layer 14 is formed, the pattern 2 is formed by the mechanical scribing device or the laser scribing device.

In a state in which the pattern 2 is formed, the window layer 15 is formed by the MOCVD method or the sputtering method.

In the patterning portion, it is conditioned such that the concentration of boron in an area connected to the back electrode layer 12 of the window layer 15 is $1\times10^{20}$ atoms/cm$^3$ or higher, the concentration of aluminum is $1\times10^{20}$ atoms/cm$^3$ or higher and the concentration of gallium is $1\times10^{20}$ atoms/cm$^3$ or higher.

Finally, a pattern 3 is formed by the mechanical scribing device or the laser scribing device.

Figure 9:
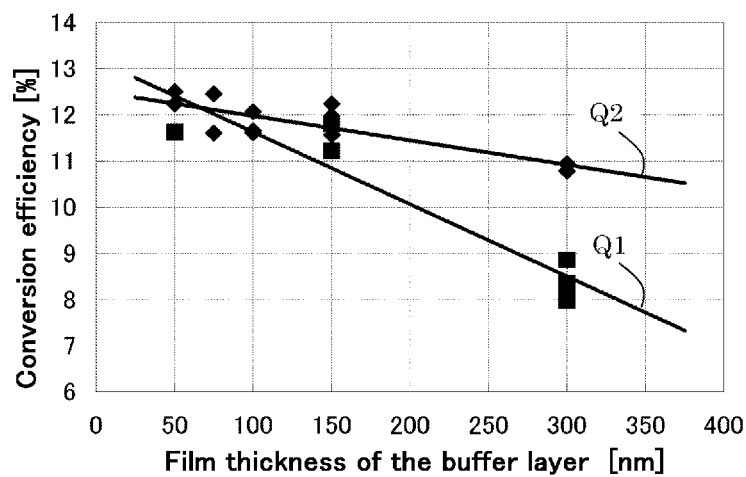
FIG. 9 is a graph illustrating relationship between the film thickness and the conversion efficiency.

Also, FIG. 9 illustrates relationship between the film thickness of the high-resistance buffer layer 14 and the conversion efficiency. Q1 in FIG. 9 represents the conversion efficiency of the conventional integrated structure and Q2 represents the conversion efficiency of the integrated structure according to this embodiment. As illustrated in FIG. 9, when setting the film thickness of the high-resistance buffer layer 14 to 300 nm or more, the conversion efficiency extremely deteriorates in the conventional integrated structure in FIG. 6.

On the other hand, in the integrated structure according to the present invention in FIG. 7, there is an effect that the conversion efficiency does not extremely deteriorate even when the film thickness is 300 nm or more.

In the integrated structure according to the present invention, patterning of the pattern 2 is performed after forming the high-resistance buffer layer 14, so that the back electrode layer 12 is allowed to directly contact the window layer 15. In this manner, it is possible to eliminate the power collection resistance loss occurring when the window layer 15 contacts the back electrode layer 12 through the ZnO buffer layer 111 as in the conventional case.

Also, it is possible to sufficiently decrease contact resistance by setting the doping impurity concentration of the window layer in the contacting portion to a certain value or higher.

In the integrated structure according to the present invention illustrated in FIG. 8, the back electrode layer 12 is first formed on the substrate 11, the back electrode layer 12 is formed into the predetermined electrode pattern (pattern 1) by the laser scribing device, and the light absorbing layer 13 is formed on the back electrode layer 12.

At the time of forming the light absorbing layer 13, the pattern 2 is formed by the mechanical scribing device or the laser scribing device.

In a state in which the pattern 2 is formed, based on the condition of the above-described embodiment, the high-resistance buffer layer 14 is formed on the light absorbing layer 13 by the MOCVD method. Further, the window layer 15 is formed by the MOCVD method or the sputtering method.

Finally, the pattern 3 is formed by the mechanical scribing device or the laser scribing device.

Since the high-resistance buffer layer 14 is formed after forming the pattern 2 in the integrated structure according to the present invention, the pattern forming portion has the same structure as the conventional structure. Although the resistance loss occurs due to the highly resistive portion, the resistance loss can be decreased to a negligible level by setting the resistivity and the film thickness of the high-resistance buffer layer 14 within a predetermined range. That is, a product of the resistivity and the film thickness is set within a range of $1 \times 10^{-3}$ to $1 \times 10^{-1} \Omega \cdot cm^2$.

Figure 10:
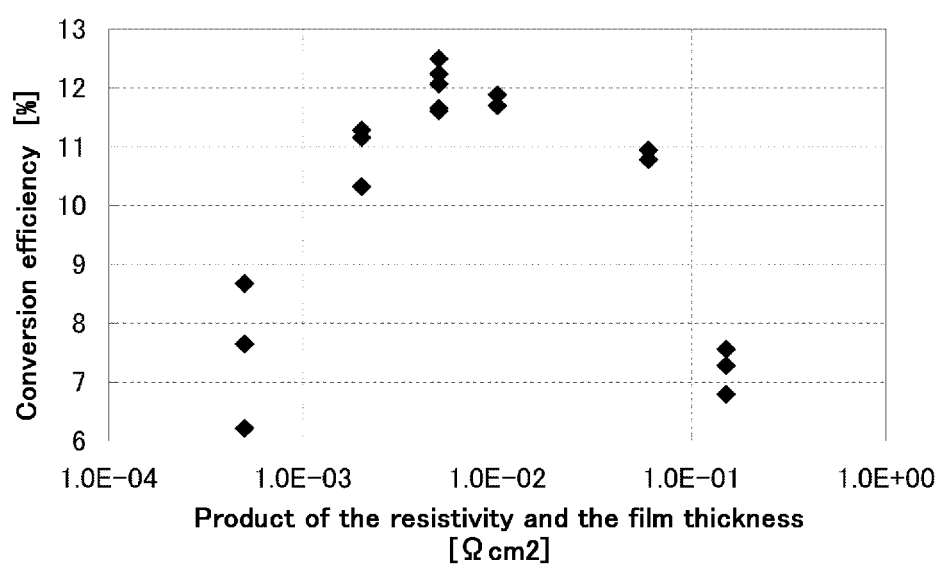
FIG. 10 is a graph illustrating relationship between a product of the resistivity and the film thickness and the conversion efficiency.

Also, FIG. 10 illustrates relationship between the product of the resistivity and the film thickness of the high-resistance buffer layer 14 and the conversion efficiency. When the product of the resistivity and the film thickness becomes larger than $1 \times 10^{-1} \Omega \cdot cm^2$, the conversion efficiency deteriorates due to the resistance loss. On the other hand, when this value is smaller than $1 \times 10^{-3} \Omega \cdot cm^2$, the conversion efficiency deteriorates because the leak in the p-n junction area is not sufficiently inhibited. A further preferable range is $5 \times 10^{-3}$ to $5 \times 10^{-2} \Omega \cdot cm^2$.

Also, by interposing a layer of $MoSe_2$ or the like, formed by reaction of selenium and/or sulfur during formation of the light absorbing layer, in a connecting portion of the pattern 2, that is, between the back electrode layer 12 and the high-resistance buffer layer 14 or between the back electrode layer 12 and the window layer 15, this layer can be made into a solid lubricant used when forming the pattern 2 by the mechanical scribing device.

The invention claimed is:

1. A method for manufacturing a CIS based thin-film solar cell, comprising the steps of:
    making a back electrode on a substrate selected from the group consisting of glass and metal;
    forming a p-type CIS based light absorbing layer on the back electrode;
    forming a buffer layer formed of a thin film of a zinc oxide group directly on the p-type CIS based light absorbing layer; and
    forming an n-type transparent conductive film formed of the thin film of a zinc oxide group on the buffer layer,
    wherein the buffer layer forming step is performed by an MOCVD method, and
    a substrate temperature of the buffer layer forming step is 190 to 300° C. which is higher than the substrate temperature at the time of forming the n-type transparent conductive film for keeping a high resistivity of the buffer layer which is 500Ω·cm or higher by avoiding diffusion of dopant from the n-type transparent conductive film to the buffer layer.

2. The method for manufacturing a CIS based thin-film solar cell according to claim 1, wherein the n-type transparent conductive film is formed by the MOCVD method.

3. The method for manufacturing a CIS based thin-film solar cell according to claim 1, wherein a film forming rate of the buffer layer is 15 nm per minute or higher.

4. The method for manufacturing a CIS based thin-film solar cell according to claim 1,
    the n-type transparent conductive film is an electrode and contains dopant.

* * * * *